United States Patent
Hsieh et al.

(10) Patent No.: US 10,840,293 B2
(45) Date of Patent: Nov. 17, 2020

(54) IMAGE SENSOR STRUCTURE

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/560,992

(22) Filed: Sep. 4, 2019

(65) Prior Publication Data

US 2019/0393262 A1 Dec. 26, 2019

Related U.S. Application Data

(62) Division of application No. 15/582,753, filed on Apr. 30, 2017, now abandoned.

(51) Int. Cl.
H01L 27/146 (2006.01)

(52) U.S. Cl.
CPC .... *H01L 27/14649* (2013.01); *H01L 27/1462* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | |
|---|---|---|
| 8,339,489 B2 | 12/2012 | Choe et al. |
| 8,593,538 B2 | 11/2013 | Nagata |
| 8,729,449 B2 * | 5/2014 | Ahn ............... H01L 27/14609 250/208.1 |
| 8,816,358 B1 | 8/2014 | Tsai et al. |
| 9,520,429 B2 | 12/2016 | Kim |
| 9,583,522 B2 | 2/2017 | Lee et al. |
| 9,780,132 B2 | 10/2017 | Lee et al. |
| 9,876,125 B2 | 1/2018 | Natsuaki et al. |
| 9,917,134 B1 * | 3/2018 | Hsieh ............... H01L 27/14685 |

(Continued)

FOREIGN PATENT DOCUMENTS

| | | |
|---|---|---|
| CN | 106412389 A | 2/2017 |
| JP | 2008235753 A | 10/2008 |

OTHER PUBLICATIONS

Final Rejection of U.S. Appl. No. 15/261,997, filed Sep. 1, 2017.

*Primary Examiner* — Telly D Green
(74) *Attorney, Agent, or Firm* — CKC & Partners Co., LLC

(57) ABSTRACT

An image sensor structure includes a substrate, a first infrared filter, a second infrared filter, a planarization layer, a color filter and a third infrared filter. The substrate has a first sensing region for detecting visible light and a second sensing region neighboring the first sensing region for detecting infrared light. The first infrared filter is disposed on the first sensing region. The second infrared filter is disposed on the second sensing region and neighbors the first infrared filter. The second infrared filter defines one or more openings for penetrating incident light. The planarization layer is over the first infrared filter and the second infrared filter, and fills the one or more openings. The color filter is on the planarization layer and vertically above the first sensing region. The third infrared filter is on the planarization layer and is vertically above the second sensing region.

10 Claims, 3 Drawing Sheets

(56) References Cited

U.S. PATENT DOCUMENTS

| | | |
|---|---|---|
| 9,966,402 B2 | 5/2018 | Nagaya et al. |
| 10,115,757 B2 | 10/2018 | Lee et al. |
| 2007/0291982 A1 | 12/2007 | Sung et al. |
| 2008/0068475 A1 | 3/2008 | Choe et al. |
| 2009/0200469 A1 | 8/2009 | Morin et al. |
| 2012/0056073 A1* | 3/2012 | Ahn ................. H01L 27/14609 250/208.1 |
| 2014/0048691 A1 | 2/2014 | Ovsiannikov et al. |
| 2016/0056195 A1 | 2/2016 | Lee et al. |
| 2016/0071894 A1 | 3/2016 | Lee et al. |
| 2016/0071895 A1 | 3/2016 | Lee et al. |
| 2016/0172398 A1 | 6/2016 | Kim |
| 2016/0211388 A1 | 7/2016 | Natsuaki et al. |
| 2017/0317131 A1 | 11/2017 | Shimada et al. |
| 2017/0317132 A1 | 11/2017 | Hatakeyama et al. |
| 2017/0345860 A1 | 11/2017 | Nagaya et al. |
| 2018/0076258 A1* | 3/2018 | Hsieh ................ H01L 27/14649 |
| 2018/0138233 A1 | 5/2018 | Hsieh et al. |

* cited by examiner

IMAGE SENSOR STRUCTURE

RELATED APPLICATIONS

This application is a divisional application of U.S. Non-Provisional application Ser. No. 15/582,753, filed Apr. 30, 2017, which is incorporated herein by reference in its entirety.

BACKGROUND

Field of the Invention

The invention relates to an image sensor structure, and more particularly to an image sensor structure which includes infrared detection function.

Description of Related Art

Image sensors have been widely used in various imaging applications and products, such as smart phones, digital cameras, scanners, etc. Furthermore, an image sensor with infrared detection function can detect infrared light as well as visible light, in order to obtain more information. With its capability of detecting infrared light, the image sensor with infrared detection function are applied for security applications, such as iris recognition, object detection, and the like.

SUMMARY

In the invention, an image sensor structure with infrared detection function is provided, which has higher luminous flux for passing infrared light, so as to enhance infrared signals converted from the detected infrared light.

One aspect of the invention is directed to an image sensor structure which includes a substrate, a color filter and a first infrared filter. The substrate has a first sensing region for detecting visible light and a second sensing region neighboring the first sensing region for detecting infrared light. The color filter is vertically above the first sensing region. The first infrared filter is vertically above the second sensing region and neighbors the color filter, in which openings are defined for penetrating incident light.

In accordance with one or more embodiments of the invention, a length and a width of each of the openings are substantially equal to or less than 400 nm.

In accordance with one or more embodiments of the invention, the first infrared filter has a grid shape that defines the openings.

In accordance with one or more embodiments of the invention, the first infrared filter is an infrared pass filter.

In accordance with one or more embodiments of the invention, the image sensor structure further includes a second infrared filter, a third infrared filter and a planarization layer. The sensor infrared filter is on the first sensing region. The third infrared filter is on the second sensing region and neighbors the second infrared filter. The planarization layer is over the second infrared filter and the third infrared filter and below the color filter and the first infrared filter.

In accordance with one or more embodiments of the invention, the second infrared filter is an infrared cutoff filter.

In accordance with one or more embodiments of the invention, the third infrared filter is a white filter.

In accordance with one or more embodiments of the invention, the third infrared filter is an infrared pass filter.

In accordance with one or more embodiments of the invention, the image sensor structure further includes a spacer layer and a microlens layer. The spacer layer is over the color filter and the first infrared filter and fills the openings. The microlens layer is on the spacer layer.

In accordance with one or more embodiments of the invention, the color filter includes a red light filtering portion, a blue light filtering portion and a green light filtering portion.

In accordance with one or more embodiments of the invention, the image sensor structure further includes at least a color photodiode and an infrared photodiode. The color photodiode is in the first sensing region of the substrate. The infrared photodiode is in the second sensing region of the substrate.

Another aspect of the invention is directed to an image sensor structure which includes a substrate, a first infrared filter, a second infrared filter, a planarization layer, a color filter and a third infrared filter. The substrate has a first sensing region for detecting visible light and a second sensing region neighboring the first sensing region for detecting infrared light. The first infrared filter is disposed on the first sensing region. The second infrared filter is disposed on the second sensing region and neighbors the first infrared filter, in which openings are defined for penetrating incident light. The planarization layer is over the first infrared filter and the second infrared filter and fills the openings. The color filter is on the planarization layer and vertically above the first sensing region. The third infrared filter is on the planarization layer and vertically above the second sensing region.

In accordance with one or more embodiments of the invention, a length and a width of each of the openings are substantially equal to or less than 400 nm.

In accordance with one or more embodiments of the invention, the second infrared filter has a grid shape that defines the openings.

In accordance with one or more embodiments of the invention, the first infrared filter is an infrared cut-off filter.

In accordance with one or more embodiments of the invention, the second infrared filter is an infrared pass filter.

In accordance with one or more embodiments of the invention, the third infrared filter is an infrared pass filter.

In accordance with one or more embodiments of the invention, the image sensor structure further includes a spacer layer and a microlens layer. The spacer layer is over the color filter and the third infrared filter. The microlens layer is on the spacer layer.

In accordance with one or more embodiments of the invention, the color filter includes a red light filtering portion, a blue light filtering portion and a green light filtering portion.

In accordance with one or more embodiments of the invention, the image sensor structure further includes at least a color photodiode and an infrared photodiode. The color photodiode is in the first sensing region of the substrate. The infrared photodiode is in the second sensing region of the substrate.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

It will be understood that, although the terms "first," "second," and "third" may be used herein to describe various elements, components, areas, layers and/or regions, these elements, components, areas, layers and/or regions, should not be limited by these terms. These terms are only used to distinguish elements, components, areas, layers and/or regions.

Figure 1:
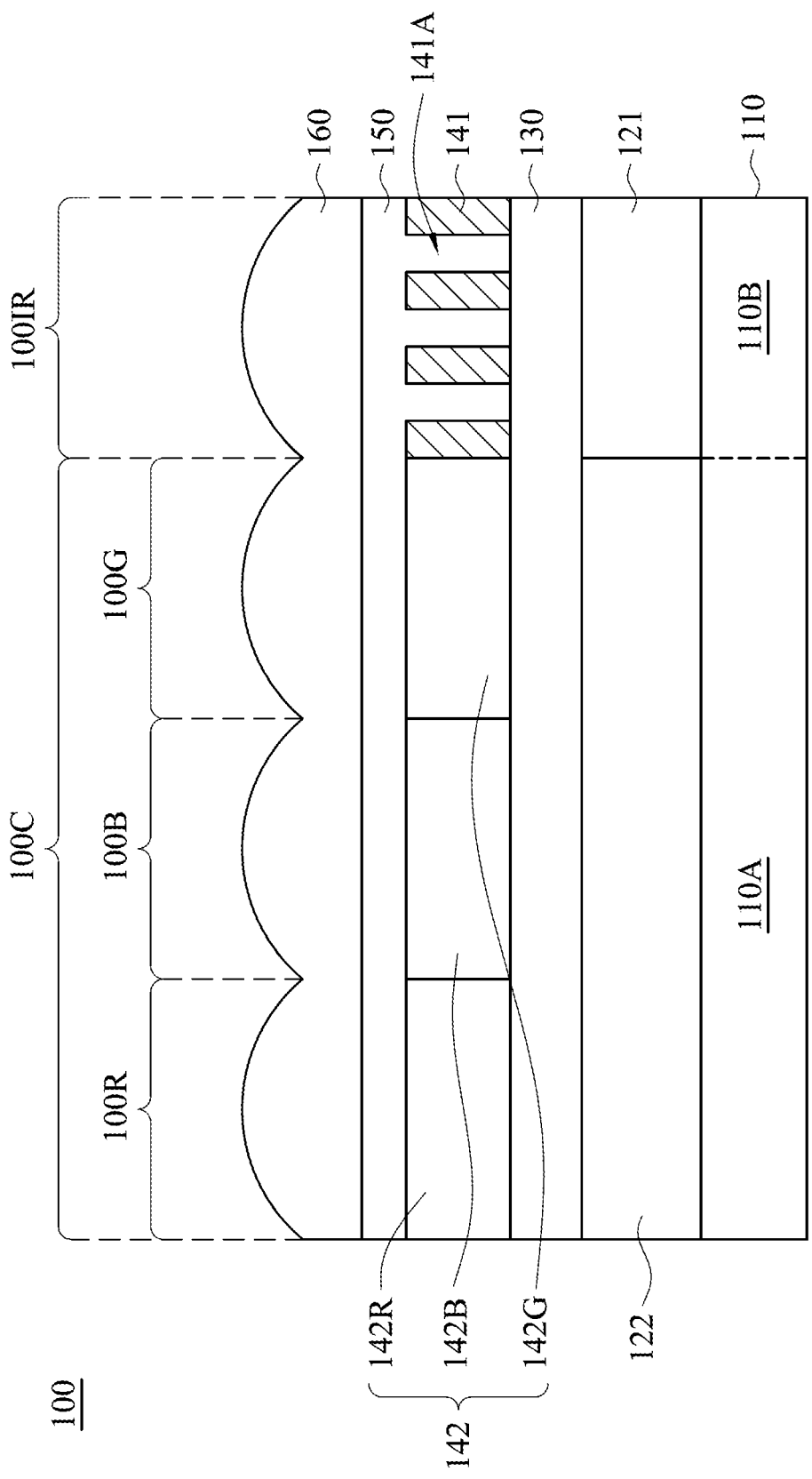
FIG. 1 is a schematic cross sectional view of an image sensor structure in accordance with some embodiments of the invention.

Referring to FIG. 1, which is a schematic cross sectional view of an image sensor structure 100 in accordance with some embodiments of the invention. The image sensor structure 100 may be a structure of a BSI (back-side illuminated) or FSI (front-side illuminated) complementary metal oxide semiconductor (CMOS) image sensor, a charge coupled device (CCD) image sensor or another similar image sensor. The image sensor structure 100 includes sensing pixels arranged in a matrix. Each sensing pixel has a color pixel area 100C for detecting visible light and an infrared pixel area 100IR for detecting infrared light. For facilitating description, FIG. 1 only illustrates a color pixel area 100C and an infrared pixel area 100IR (i.e. a sensing pixel), but the invention is not limited thereto. The color pixel area 100C includes a red pixel area 100R for detecting incident light in a red color wavelength band, a blue pixel area 100B for detecting incident light in a blue color wavelength band and a green pixel area 100G for detecting incident light in a green color wavelength band.

As shown in FIG. 1, the image sensor structure 100 includes a substrate 110, infrared filters 121, 122 and 141, a planarization layer 130, a color filter 142, a spacer layer 150 and a microlens layer 160. The substrate 110 may be a semiconductor wafer, a silicon-on-insulator (SOI) substrate or a glass substrate, but is not limited thereto. As shown in FIG. 1, the substrate 110 has a visible light sensing region 110A and an infrared light sensing region 110B for each sensing pixel. In the substrate 110, three color photodiodes (not shown) may be respectively arranged in the red pixel area 100R, the blue pixel area 100B and the green pixel area 100G for detecting red light, blue light and green light, and an infrared photodiode (not shown) may be arranged in the infrared pixel area 100IR for detecting infrared light.

The infrared filter 121 is disposed on the infrared light sensing region 110B of the substrate 110 for permitting infrared light to pass therethrough. In some embodiments, the infrared filter 121 is an infrared pass filter, which may cut off incident light within a wavelength range lower than 850 nm. The infrared filter 121 may be an infrared pass filter, which is formed for permitting infrared light to pass therethrough. The infrared filter 121 may include a photo-type material, and may be formed by utilizing a lithographic patterning process or another suitable process. In certain embodiments, the infrared filter 121 may be a white filter, which is utilized for permitting infrared light and visible light to pass therethrough, so as to increase its luminous flux.

The infrared filter 122 is disposed on the visible light sensing region 110A of the substrate 110 and neighboring the infrared filter 121 for permitting visible light to pass therethrough. In some embodiments, the infrared filter 122 is an infrared cutoff filter, which may cut off incident light within a wavelength range higher than 850 nm. The infrared filter 122 may include an etchable material, and may be formed by utilizing, for example, a coating process and an etching process.

The planarization layer 130 is disposed over the infrared filters 121 and 122 to provide a flat surface for the infrared filter 141 and the color filter 142 to be disposed thereon. The planarization layer 130 may include an acrylic material, an epoxy material or another suitable material, and may be formed by utilizing, for example, a coating process or another suitable process.

The infrared filter 141 is disposed in the infrared pixel area 100IR for permitting infrared light to pass therethrough, as well as the infrared filter 121. The infrared filter 141 is vertically above the infrared light sensing region 110B, and in some embodiments, the infrared filter 141 is an infrared pass filter, which may cut off incident light within a wavelength range lower than 850 nm. In such case, the infrared filter 121 may alternatively be a white filter for permitting infrared light and visible light to pass therethrough, so as to increase its luminous flux. The infrared filter 141 may include a photo-type material, and may be formed by utilizing a lithographic patterning process or another suitable process.

Figure 2:
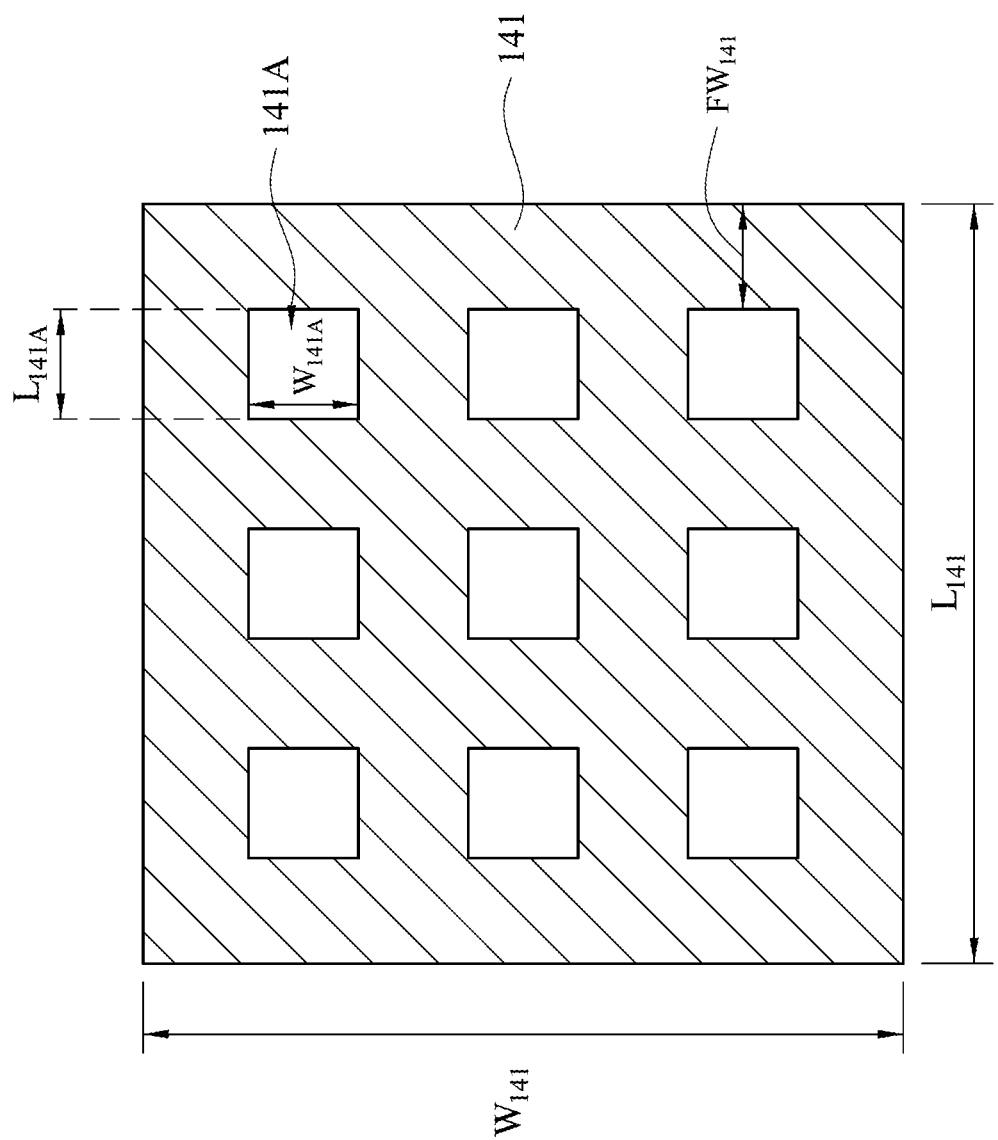
FIG. 2 exemplarily illustrates a top view of an infrared filter of FIG. 1 in accordance with some embodiments of the invention.

Particularly, the infrared filter 141 defines openings 141A therein. FIG. 2 exemplarily illustrates a top view of the infrared filter 141 of FIG. 1 in accordance with some embodiments of the invention. As shown in FIG. 2, the infrared filter 141 has a grid shape which defines the openings 141A arranged in a matrix. Each of the openings 141A has a rectangular top-view shape, and the length $L_{141A}$ and the width $W_{141A}$ of each of the openings 141A may be less than 400 nm, in order to increase diffraction efficiency and luminous flux of the infrared filter 141. However, the rectangular top-view shapes of the openings 141A shown in FIG. 2 are not intended to limit the scope of the invention. For example, each of the openings 141A may alternatively has a circular top-view shape, an ellipse top-view shape or another suitable top-view shape. In some embodiments, the length $L_{141A}$ and the width $W_{141A}$ of each of the openings 141A are between 300 nm and 400 nm. Further, in various embodiments, the openings 141A may have different lengths $L_{141A}$, widths $W_{141A}$ and/or top-view shapes. The length $L_{141}$, the width $W_{141}$ and the frame width $FW_{141}$ of the infrared filter 141 may be determined depending on various design requirements. In some embodiments, the length $L_{141}$ and the width $W_{141}$ of the infrared filter 141 are about 2.8 μm, the length $L_{141}$ and the width $W_{141}$ of the infrared filter 141 are about 2.8 μm, and the of the infrared filter 141 is about 0.4 μm. The number of the openings 141A may also be determined depending on various design requirements, and is not limited to that shown in FIG. 2.

Referring back to FIG. 1, the color filter 142 is disposed in the color pixel area 100C and neighboring the infrared filter 141. The color filter 142 is vertically above the visible light sensing region 110A and has a red light filtering portion 142R, a blue light filtering portion 142B and a green light filtering portion 142G, which allows red light, blue light and green light to pass therethrough, respectively. Each of the red light filtering portion 142R, the blue light filtering portion 142B and the green light filtering portion 142G may include dyed or pigmented organic polymer with a desired color, and may be formed by utilizing a patterning process and other suitable processes known in the art.

The spacer layer 150 is disposed on the infrared filter 141 and the color filter 142 to keep the microlens layer 160 apart from the infrared filter 141 and the color filter 142, and also fills the openings 141A. The spacer layer 150 may include a glass material, a flowable material or another optical transparent material by utilizing a deposition process or other processes known in the art.

The microlens layer 160 is disposed on the spacer layer 150. As shown in FIG. 1, the microlens layer 160 has convex shapes at its light receiving side for focusing incident light onto the photodiodes (not shown) and the infrared photodiode (not shown), in order to increase light sensitivity of the image sensor structure 100. Each of the convex shapes of the microlens layer 160 may correspond to a subpixel area (i.e. the red pixel area, the blue pixel area, the green pixel area or the infrared pixel area). The microlens layer 160 may include any suitable material with high transmittance, such as acrylic polymer or another suitable material.

Figure 3:
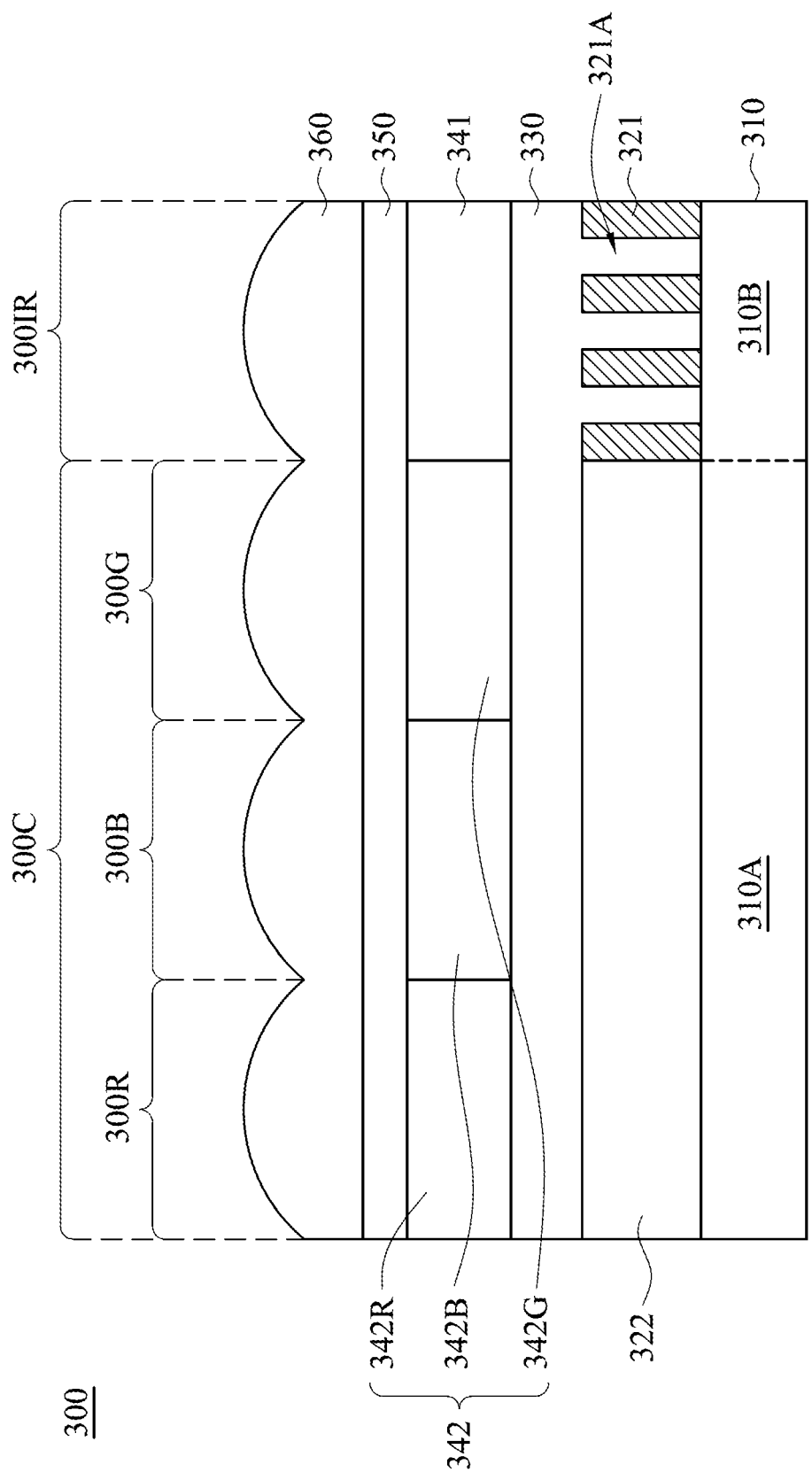
FIG. 3 is a schematic cross sectional view of an image sensor structure in accordance with some embodiments of the invention.

Referring to FIG. 3, which is a schematic cross sectional view of an image sensor structure 300 in accordance with some embodiments of the invention. Similar to the image sensor structure 100 of FIG. 1, the image sensor structure 300 may be a BSI or FSI CMOS image sensor, a CCD image sensor or another similar image sensor. The image sensor structure 300 includes sensing pixels arranged in a matrix. Each sensing pixel has a color pixel area 300C for detecting visible light and an infrared pixel area 300IR for detecting infrared light. For facilitating description, FIG. 3 only illustrates a color pixel area 300C and an infrared pixel area 300IR (i.e. a sensing pixel). The color pixel area 300C includes a red pixel area 300R for detecting incident light in a red color wavelength band, a blue pixel area 300B for detecting incident light in a blue color wavelength band and a green pixel area 300G for detecting incident light in a green color wavelength band.

As shown in FIG. 3, the image sensor structure 300 includes a substrate 310, infrared filters 321, 322 and 341, a planarization layer 330, a color filter 342, a spacer layer 350 and a microlens layer 360. As shown in FIG. 3, the substrate 310 has a visible light sensing region 310A and an infrared light sensing region 310B for each sensing pixel. In the substrate 310, three color photodiodes (not shown) may be respectively arranged in the red pixel area 300R, the blue pixel area 300B and the green pixel area 300G for detecting red light, blue light and green light, and an infrared photodiode (not shown) may be arranged in the infrared pixel area 300IR for detecting infrared light.

The substrate 310, the infrared filter 322, the color filter 342 of the image sensor structure 300 are similar to the substrate 110, the infrared filter 122, the color filter 142 of the image sensor structure 100, respectively, and the details are not repeated herein.

The infrared filter 321 is disposed on the infrared light sensing region 310B of the substrate 310 for permitting infrared light to pass therethrough. In some embodiments, the infrared filter 321 is an infrared pass filter, which may cut off incident light within a wavelength range lower than 850 nm. The infrared filter 321 may include a photo-type material, and may be formed by utilizing a lithographic patterning process or another suitable process. The infrared filter 321 defines openings 321A therein. The sizes and the shapes of the infrared filter 321 and the openings 321A may be similar to those of the infrared filter 141 and the openings 141A of the image sensor structure 100, in order to increase diffraction efficiency and luminous flux of the infrared filter 321. Also, the size and the frame width of the infrared filter 321, the top-view shape of each of the openings 321A and the number of the openings 321A may also be determined depending on various design requirements.

The planarization layer 330 is disposed over the infrared filters 321 and 322 to provide a flat surface for the infrared filter 341 and the color filter 342, and also fills the openings 321A. The planarization layer 330 may include an acrylic material, an epoxy material, a flowable material or another suitable material, and may be formed by utilizing, for example, a coating process or another suitable process.

The infrared filter 341 is disposed in the infrared pixel area 300IR for permitting infrared light to pass therethrough, as well as the infrared filter 321. In some embodiments, the infrared filter 341 is an infrared pass filter, which may cut off incident light within a wavelength range lower than 850 nm. The infrared filter 341 may be an infrared pass filter, which is formed for permitting infrared light to pass therethrough. The infrared filter 341 may include a photo-type material, and may be formed by utilizing a lithographic patterning process or another suitable process. In a case that the infrared filter 321 is an infrared pass filter, the infrared filter 341 may alternatively be a white filter, which is utilized for permitting infrared light and visible light to pass therethrough, so as to increase its luminous flux.

The spacer layer 350 is disposed on the infrared filter 341 and the color filter 342 to keep the microlens layer 360 apart from the infrared filter 341 and the color filter 342. The spacer layer 350 may include a glass material or another optical transparent material by utilizing a deposition process or other processes known in the art.

The microlens layer 360 is disposed on the spacer layer 350. As shown in FIG. 3, the microlens layer 360 has convex shapes at its light receiving side for focusing incident light onto the photodiodes (not shown) and the infrared photodiode (not shown), in order to increase light sensitivity of the image sensor structure 300. Each of the convex shapes of the microlens layer 360 may correspond to a subpixel area (i.e. the red pixel area, the blue pixel area, the green pixel area or the infrared pixel area). The microlens layer 360 may include any suitable material with high transmittance, such as acrylic polymer or another suitable material. In another embodiment, the microlens layer 360 may alternatively be directly disposed on the infrared filter 341 and the color filter 342.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. An image sensor structure, comprising:
   a substrate having a first sensing region for detecting visible light and a second sensing region neighboring the first sensing region for detecting infrared light;
   a first infrared filter disposed on the first sensing region;
   a second infrared filter disposed on the second sensing region and neighboring the first infrared filter, wherein the second infrared filter defines one or more openings for diffracting incident light;
   a planarization layer over the first infrared filter and the second infrared filter and filling the one or more openings;

a color filter on the planarization layer and vertically above the first sensing region; and a third infrared filter on the planarization layer and vertically above the second sensing region;

wherein the planarization layer is interposed between the second and third infrared filters to vertically separate the second and third infrared filters.

2. The image sensor structure of claim 1, wherein a length and a width of each of the one or more openings are substantially equal to or less than 400 nm.

3. The image sensor structure of claim 1, wherein the second infrared filter has a grid shape that defines the one or more openings.

4. The image sensor structure of claim 1, wherein the first infrared filter is an infrared cut-off filter.

5. The image sensor structure of claim 1, wherein the second infrared filter is an infrared pass filter.

6. The image sensor structure of claim 1, wherein the third infrared filter is an infrared pass filter.

7. The image sensor structure of claim 1, further comprising:

a spacer layer over the color filter and the third infrared filter; and a microlens layer on the spacer layer.

8. The image sensor structure of claim 1, wherein the color filter comprises a red light filtering portion, a blue light filtering portion and a green light filtering portion.

9. The image sensor structure of claim 1, further comprising:

at least a color photodiode in the first sensing region of the substrate; and an infrared photodiode in the second sensing region of the substrate.

10. The image sensor structure of claim 1, wherein the substrate has an upper surface, and when viewed from above in a direction normal to the upper surface of the substrate, each of the openings of the second infrared filter is rectangular, and a length and a width forming each of the openings is less than 400 nm.

* * * * *